United States Patent [19]

Widmayer et al.

[11] 4,268,105
[45] May 19, 1981

[54] TRANSIENT SUPPRESSION CONNECTOR

[75] Inventors: Henry J. Widmayer, San Jose; Albert T. Cronin, Los Altos, both of Calif.

[73] Assignee: The United States of America as represented by the Secretary of the Navy, Washington, D.C.

[21] Appl. No.: 82,504

[22] Filed: Oct. 9, 1979

[51] Int. Cl.³ .............................................. H03H 7/00
[52] U.S. Cl. ............................... 339/147 R; 333/182; 333/185
[58] Field of Search .................... 333/12, 181–185, 333/254; 361/401; 339/14 R, 14 L, 143, 147

[56] References Cited

U.S. PATENT DOCUMENTS

| | | | |
|---|---|---|---|
| 3,226,603 | 12/1965 | Finn et al. | 317/101 |
| 3,255,330 | 6/1966 | Mackenzie et al. | 200/124 |
| 3,594,687 | 7/1971 | Alderfer | 339/14 R |
| 3,961,294 | 6/1976 | Hollyday | 333/79 |
| 4,079,343 | 3/1978 | Nijman | 333/79 |
| 4,126,840 | 11/1978 | Selvin | 333/79 |
| 4,173,745 | 11/1979 | Saunders | 333/182 |

Primary Examiner—Eugene F. Desmond
Attorney, Agent, or Firm—R. S. Sciascia; Charles D. B. Curry; Francis I. Gray

[57] ABSTRACT

A transient suppression connector which is a self-contained unitary assembly having the transient suppression components connected between the electrical cable and the electronics package case. A connector adaptor about the electrical connector at the end of the cable is attached to the package case. An adaptor plate connected to the connector adaptor supports the electronic circuit board within the package. The transient suppression components are connected between a ground plane and a circuit board contained within the connector adaptor, the ground plane being electrically connected via the connector adaptor to the package case. The pins of the electrical connector extend through the suppression circuit board to the electronic circuit board, being electrically connected to both. Thus, the transient suppression components are connected between the electrical connector and the package case.

1 Claim, 3 Drawing Figures

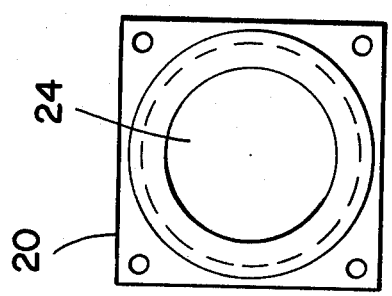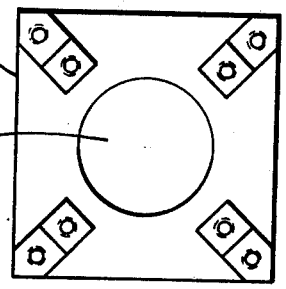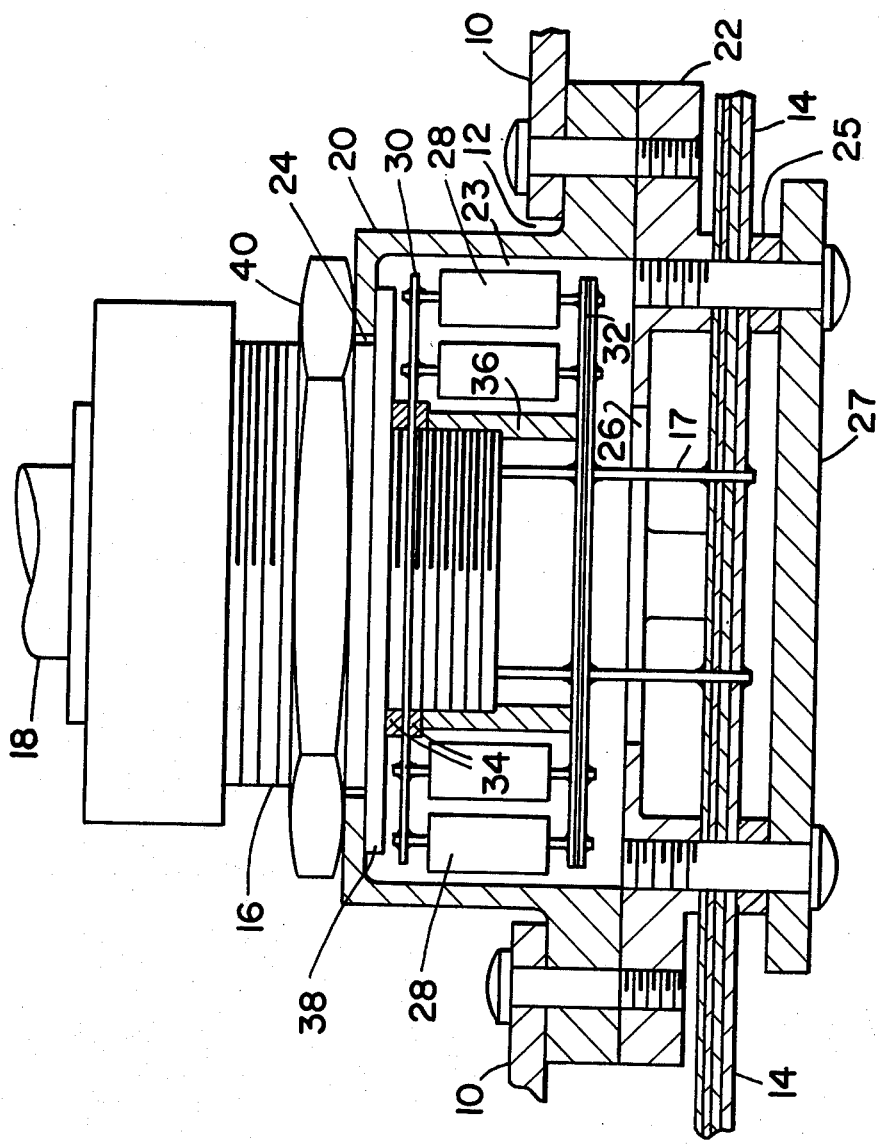

TRANSIENT SUPPRESSION CONNECTOR

BACKGROUND OF THE INVENTION

1. Field of the Invention

The present invention relates to electronic circuit protection devices, and more particularly to a wholly self-contained connector and transient suppression assembly as one unit which protects electronic circuits from cable induced transients.

2. Description of Prior Art

Semi-conductor electronics contained in a shielded package are generally immune from electro-magnetic interference (EMI). However these packages are interconnected by electrical cables which penetrate the package. Thus, any transients which occur in one package or which are induced in the cable due to external electromagnetic environments are transmitted to other packages via the cable. Such cable induced transients may result in degraded performance of the semi-conductor electronics. Previous attempts to limit these transients used capacitors, resistors and inductors in the electronic circuit design for series or shunt impedance limiting. It is desirable to have the transient suppression devices located at the point of cable entry to the package and between the electrical connector and the package case so that additional electronic circuit design for each circuit within the package is eliminated.

SUMMARY OF THE INVENTION

Accordingly the present invention provides a wholly self-contained connector and transient suppression assembly as one unit with the semi-conductor transient suppression devices connected between the electrical connector and the electronics package case to provide the requisite low inductance, dissipative path for cable induced transient energy. A connector adaptor encloses the end of the electrical connector and is attached to the package case. An adaptor plate connected to the connector adaptor supports a multi-component electronic circuit board within the package to which the pins of the electrical connector are connected. Semi-conductor transient suppression components are connected between a ground plane and a connector multi-component board, the ground plane and the connector multi-component board surrounding the end of the electrical connector within the connector adaptor. The electrical connector pins are connected to the connector multi-component board. The ground plane is maintained in contact with the connector adaptor, and thus the package case, by conductive washers and a retaining nut which threadedly engages the end of the electrical connector. The result is a transient suppression connector which is self-contained with the suppression components being between the electrical connector and the package case.

Therefore, it is an object of the present invention to provide a transient suppression connector to protect electronic circuits from cable induced transients.

Another object of the present invention is to provide a transient suppression connector which is wholly self-contained.

Yet another object of the present invention is to provide a transient suppression connector which minimizes design of the electronic circuits within an electronics package.

Other objects, advantages and novel features of the present invention will be readily apparent from the following detailed description with appended claims and attached drawing.

BRIEF DESCRIPTION OF THE DRAWING

FIG. 1 is a cross-sectional view of a transient suppression connector according to the present invention.

FIG. 2 is a top plan view of the connector adaptor of FIG. 1.

FIG. 3 is a bottom plan view of the adaptor plate of FIG. 1.

DESCRIPTION OF THE PREFERRED EMBODIMENT

Referring now to FIGS. 1-3, an electronics package case 10 is shown having a connector opening 12 and a multi-component electronic circuit board 14 contained within. An electrical connector 16 having a plurality of pins 17 is at the end of a cable 18. The electrical connector 16, a jam nut type receptacle for example, is to be connected through the connector opening 12 to the circuit board 14.

A connector adaptor 20, having a flange, and an adaptor plate 22 are attached by suitable means, such as screws, rivets or the like, to each other and to the package case 10. The electrical connector 16 is contained in the cavity 23 formed by the connector adaptor 20 and the adaptor plate 22. The multi-component electronic circuit board 14 is attached to the bottom of the adaptor plate by suitable means, such as screws, rivets or the like. Standoffs 25 and a shield 27 provide EMI shielding for the ends of the pins 17 without shorting the pins, as well as providing space to enable rinsing of the solder flux and inspection of the solder joints. The connector adaptor 20 has an opening 24 external to the package case 10 through which the cable 18 extends, and the adaptor plate 22 has an opening 26 through which the pins 17 extend to connect with the circuit board 14.

A plurality of standard transient suppression components 28 are contained around the electrical connector 16 within the cavity 23. A ground plane 30 through which the electrical connector 16 protrudes forms one point of connection for the components 28, and an adaptor electronic circuit board 32 through which the pins 17 protrude, and to which the pins are also connected, forms the second point of connection for the components. The ground plane 30 is kept in electrical contact with the package case 10 via washers 34 and a nut 36 which threadedly engages the electrical connector 16 to hold the ground plane/washer assembly firmly against a connector body flange 38 which is in contact with the case. A connector jam nut 40 which threadedly engages the electrical connector 16 exterior to the cavity 23 holds the electrical connector/transient suppression assembly firmly in place.

The ground plane 30, washers 34 and connector body flange 38 are electrically conductive so that the ground plane is electrically grounded to the package case 10. Typically, the ground plane 30 has a polyimide film core with a copper film deposited on both sides. The adaptor circuit board 32 has the appropriate electrical circuit pattern to interconnect the semi-conductor components 28 to the pins 17 with a distribution of one semi-conductor suppression component per pin. Cavity 23 may be sized to accomodate suppression devices 28 for all pins 17 of electrical connector 16.

Thus, the present invention provides a transient suppression connector which is self-contained with the suppression components connected between the package case and the electrical connector in an electrically desirable manner.

What is claimed is:

1. A transient suppression connector for suppressing cable induced transients comprising:
   (a) an electrical connector at the end of an electrical cable, said electrical connector having a plurality of pins, said pins to be connected to an electronic circuit board within an electronics package case;
   (b) a connector adaptor in the form of a cup having a connector hole in the base and a flange at the rim for attachment to said package case, said adaptor forming a cavity about said electrical connector;
   (c) an adaptor plate having a central hole through which said pins protrude and having means for attaching to said connector adaptor and said electronic circuit board;
   (d) means for attaching said adaptor housing to said electronics package case and to said electronic circuit board;
   (e) a plurality of transient suppression components situated within said cavity about said electrical connector;
   (f) a ground plane to which one end of each of said transient suppression components is connected;
   (g) an adaptor circuit board having an electronic circuit pattern to which the other end of each of said transient suppression components is connected and to which said pins are connected;
   (h) a washer about said electrical connector on each side of said ground plane; and
   (i) a retaining nut which threadedly engages the end of said electrical connector and abuts said washer on the underside of said ground plane with sufficient force to maintain electrical contact between said ground plane and said adaptor housing thereby forming a minimum inductance transient suppression electrical circuit between said package case and said pins.

* * * * *